(12) United States Patent
Sakakibara et al.

(10) Patent No.: US 11,342,527 B2
(45) Date of Patent: May 24, 2022

(54) LIGHT-EMITTING ELEMENT HAVING COMMONLY FORMED HOLE TRANSPORT LAYER AND ANODE ELECTRODE AND LIGHT-EMITTING DEVICE

(71) Applicant: SHARP KABUSHIKI KAISHA, Sakai (JP)

(72) Inventors: Yusuke Sakakibara, Osaka (JP); Kenji Kimoto, Osaka (JP); Tatsuya Ryohwa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/040,941

(22) PCT Filed: Mar. 29, 2018

(86) PCT No.: PCT/JP2018/013253
§ 371 (c)(1),
(2) Date: Sep. 23, 2020

(87) PCT Pub. No.: WO2019/186896
PCT Pub. Date: Oct. 3, 2019

(65) Prior Publication Data
US 2021/0028385 A1  Jan. 28, 2021

(51) Int. Cl.
*H01L 29/08* (2006.01)
*H01L 51/50* (2006.01)
(Continued)

(52) U.S. Cl.
CPC ...... *H01L 51/5056* (2013.01); *H01L 27/3244* (2013.01); *H01L 51/502* (2013.01);
(Continued)

(58) Field of Classification Search
CPC ............ H01L 51/5056; H01L 27/3244; H01L 51/502; H01L 51/5072; H01L 51/56;
(Continued)

(56) References Cited

U.S. PATENT DOCUMENTS 8,471,943 B2 * 6/2013 Ito ..................... H01L 27/3209
348/374
9,385,345 B2 * 7/2016 Lee ..................... H01L 51/506
(Continued)

FOREIGN PATENT DOCUMENTS

JP  2006-189814 A  7/2006
JP  2007-115603 A  5/2007
(Continued)

*Primary Examiner* — Caleb E Henry
(74) *Attorney, Agent, or Firm* — ScienBiziP, P.C.

(57) ABSTRACT

For a purpose of simplifying a structure of a light-emitting element while maintaining luminous efficiency of the light-emitting element, the present invention provides a light-emitting element including: a cathode electrode; an anode electrode; a light-emitting layer between the cathode electrode and the anode electrode; an electron transport layer between the light-emitting layer and the cathode electrode; and a hole transport layer between the light-emitting layer and the anode electrode. The light-emitting element further includes a plurality of subpixels for each light emission wavelength of the light-emitting layer, the light-emitting layer and the electron transport layer for each of the plurality of subpixels, and the hole transport layer common to at least the plurality of subpixels.

20 Claims, 11 Drawing Sheets

(51) Int. Cl.
*H01L 27/32* (2006.01)
*H01L 51/56* (2006.01)

(52) U.S. Cl.
CPC .......... *H01L 51/5072* (2013.01); *H01L 51/56* (2013.01); *H01L 2227/323* (2013.01)

(58) Field of Classification Search
CPC ............. H01L 2227/323; H01L 27/322; H01L 2251/303; H05B 33/02; H05B 33/10; H05B 33/12; H05B 33/14
See application file for complete search history.

(56) References Cited

U.S. PATENT DOCUMENTS

| | | | |
|---|---|---|---|
| 10,256,438 B2* | 4/2019 | Kim | H01L 51/5253 |
| 2008/0246407 A1 | 10/2008 | Yoshida et al. | |
| 2009/0170230 A1* | 7/2009 | Kidu | H01L 51/0005 |
| | | | 118/314 |
| 2010/0224934 A1 | 9/2010 | Yoshida et al. | |
| 2012/0056550 A1 | 3/2012 | Yoshida et al. | |
| 2012/0242217 A1* | 9/2012 | Matsumoto | H01L 27/3213 |
| | | | 313/504 |
| 2012/0252149 A1* | 10/2012 | Hiroki | H01L 27/3211 |
| | | | 118/721 |
| 2012/0252150 A1* | 10/2012 | Hiroki | H01L 51/56 |
| | | | 438/34 |
| 2012/0276960 A1 | 11/2012 | Yoshida et al. | |
| 2013/0207082 A1 | 8/2013 | Cho et al. | |
| 2013/0320837 A1* | 12/2013 | Weaver | H05B 33/14 |
| | | | 313/504 |
| 2013/0341627 A1 | 12/2013 | Yoshida et al. | |
| 2014/0065750 A1* | 3/2014 | Harikrishna Mohan | |
| | | | H01L 51/5036 |
| | | | 438/35 |
| 2014/0319491 A1 | 10/2014 | Yoshida et al. | |
| 2015/0179716 A1 | 6/2015 | Kuroda | |
| 2016/0181532 A1 | 6/2016 | Ando et al. | |
| 2016/0293875 A1 | 10/2016 | Zhang et al. | |
| 2016/0380240 A1* | 12/2016 | Ha | H01L 21/67742 |
| | | | 257/40 |
| 2017/0012231 A1* | 1/2017 | Mishima | H01L 27/3244 |
| 2017/0098793 A1* | 4/2017 | Isomura | H01L 51/508 |
| 2017/0117337 A1 | 4/2017 | Kimura et al. | |
| 2017/0133437 A1* | 5/2017 | Komatsu | H01L 51/5265 |
| 2017/0155074 A1 | 6/2017 | Kim et al. | |
| 2017/0207281 A1* | 7/2017 | Hack | H01L 27/3213 |
| 2018/0019428 A1* | 1/2018 | Kawamura | H01L 51/5004 |
| 2018/0122870 A1* | 5/2018 | Park | H01L 51/5206 |
| 2018/0375058 A1* | 12/2018 | Kawamura | H01L 51/5036 |

FOREIGN PATENT DOCUMENTS

| | | |
|---|---|---|
| JP | 2010-244885 A | 10/2010 |
| JP | 2013-168649 A | 8/2013 |
| JP | 2014-078381 A | 5/2014 |
| JP | 2017-083517 A | 5/2017 |
| JP | 2017-103224 A | 6/2017 |
| JP | 2018-010203 A | 1/2018 |
| WO | 2014/013586 A1 | 1/2014 |
| WO | 2015/041053 A1 | 3/2015 |

\* cited by examiner

LIGHT-EMITTING ELEMENT HAVING COMMONLY FORMED HOLE TRANSPORT LAYER AND ANODE ELECTRODE AND LIGHT-EMITTING DEVICE

TECHNICAL FIELD

The disclosure relates to a light-emitting element including quantum dots, a light-emitting device including the light-emitting element, a manufacturing method of a light-emitting element, and a manufacturing apparatus of a light-emitting element.

BACKGROUND ART

PTL 1 discloses an organic electroluminescence image device including a plurality of pixels. In JP 2010-244885 A (published on Oct. 28, 2010), each of the pixels includes a light-emitting element including an anode electrode, a hole transport layer, a light-emitting layer, an electron transport layer, and a cathode electrode. Furthermore, JP 2010-244885 A (published on Oct. 28, 2010) 1 describes a configuration in which a different light-emitting layer is formed for each subpixel, and a hole transport layer and an electron transport layer are similarly formed for each subpixel.

SUMMARY

When a hole transport layer and an electron transport layer are formed in each subpixel, there is a problem in that a structure of a light-emitting element becomes complicated, and a manufacturing step of the light-emitting element also becomes complicated and takes quite some time. However, when the hole transport layer and the electron transport layer are formed in common to all of the subpixels, there is a problem in that efficiency of recombination in a light-emitting layer between positive holes from an anode electrode and electrons from a cathode electrode decreases depending on a type of the subpixels.

In order to solve the problem described above, a light-emitting element according to the disclosure includes: a cathode electrode; an anode electrode; a light-emitting layer between the cathode electrode and the anode electrode; an electron transport layer between the light-emitting layer and the cathode electrode; and a hole transport layer between the light-emitting layer and the anode electrode, where the light-emitting element further includes a plurality of subpixels for each light emission wavelength of the light-emitting layer, the light-emitting layer and the electron transport layer for each of the plurality of subpixels, and the hole transport layer common to at least the plurality of subpixels.

Further, in order to solve the problem described above, a manufacturing method of a light-emitting element according to the disclosure that includes: a cathode electrode; an anode electrode; a light-emitting layer between the cathode electrode and the anode electrode; an electron transport layer between the light-emitting layer and the cathode electrode; and a hole transport layer between the light-emitting layer and the anode electrode, and includes a plurality of subpixels for each light emission wavelength of the light-emitting layer is a manufacturing method of a light-emitting element including: a light-emitting layer formation step of forming the light-emitting layer for each of the plurality of subpixels; an electron transport layer formation step of forming the electron transport layer for each of the plurality of subpixels; and a hole transport layer formation step of forming the hole transport layer common to at least the plurality of subpixels.

Further, in order to solve the problem described above, a manufacturing apparatus of a light-emitting element according to the disclosure that includes: a cathode electrode; an anode electrode; a light-emitting layer between the cathode electrode and the anode electrode; an electron transport layer between the light-emitting layer and the cathode electrode; and a hole transport layer between the light-emitting layer and the anode electrode, and includes a plurality of subpixels for each light emission wavelength of the light-emitting layer is a manufacturing apparatus of a light-emitting element including a film formation apparatus that forms the light-emitting layer and the electron transport layer for each of the plurality of subpixels, and forms the hole transport layer common to at least the plurality of subpixels.

Advantageous Effects of Disclosure

The configuration described above can provide a light-emitting element having a simplified structure while maintaining transport efficiency of positive holes from an anode electrode to a light-emitting layer and transport efficiency of electrons from a cathode electrode to the light-emitting layer, and maintaining luminous efficiency.

DESCRIPTION OF EMBODIMENTS

Figure 1:
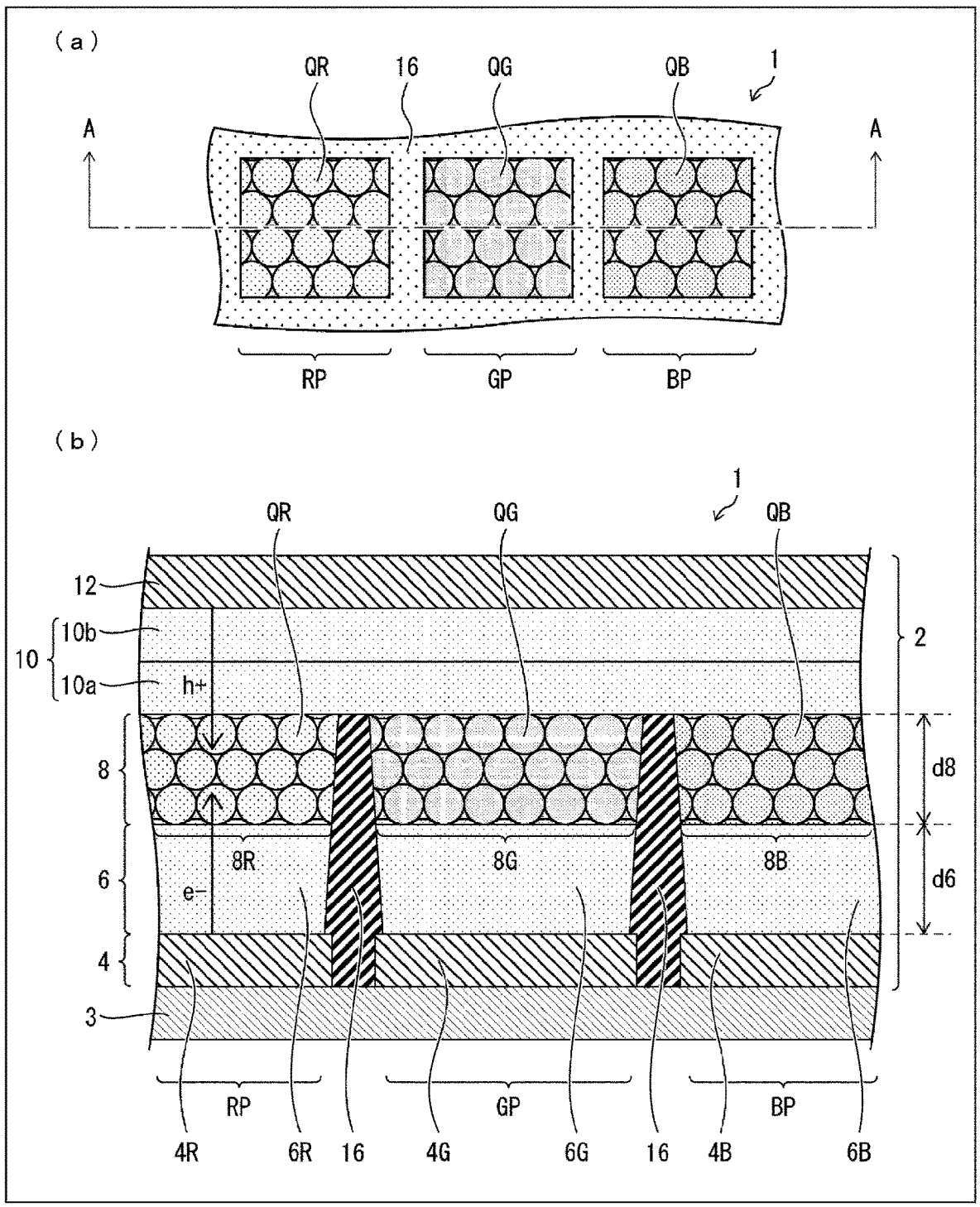
FIG. 1 includes a schematic top view and a schematic cross-sectional view of a light-emitting device according to a first embodiment of the disclosure.

First Embodiment (a) of FIG. 1 is a schematic top view of a light-emitting device 1 according to the present embodiment. (b) of FIG. 1 is a cross-sectional view taken along a line A-A in the direction of the arrows in (a) of FIG. 1. Note that, in (a) of FIG. 1, an upper face of the light-emitting device 1 is illustrated by transmitting through a hole transport layer 10 and an anode electrode 12 in order to make detailed illustrate a light-emitting layer 8 described below.

As illustrated in (b) of FIG. 1, the light-emitting device 1 according to the present embodiment includes a light-emitting element 2 and an array substrate 3. The light-emitting device 1 has a structure in which respective layers of the light-emitting element 2 are layered on the array substrate 3 in which a thin film transistor (TFT; not illustrated) is formed. In the present specification, a direction from the light-emitting element 2 to the array substrate 3 of the light-emitting device 1 is referred to as "downward," and a direction from the array substrate 3 of the light-emitting device 1 to the light-emitting element 2 is referred to as "upward".

The light-emitting element 2 includes an electron transport layer 6, the light-emitting layer 8, the hole transport layer 10, and the anode electrode 12 on a cathode electrode 4 in order from a bottom layer. The cathode electrode 4 of the light-emitting element 2 formed in a layer on the array substrate 3 is electrically connected with TFTs of the array substrate 3.

Here, each of the cathode electrode 4, the electron transport layer 6, and the light-emitting layer 8 is separated by an edge cover 16. Particularly, in the present embodiment, the cathode electrode 4 is separated into a red pixel cathode electrode 4R, a green pixel cathode electrode 4G, and a blue pixel cathode electrode 4B by the edge cover 16. Further, the electron transport layer 6 is separated into a red pixel electron transport layer 6R, a green pixel electron transport layer 6G, and a blue pixel electron transport layer 6B by the edge cover 16. Furthermore, the light-emitting layer 8 is separated into a red pixel light-emitting layer 8R, a green pixel light-emitting layer 8G, and a blue pixel light-emitting layer 8B by the edge cover 16. Note that the hole transport layer 10 and the anode electrode 12 are not separated by the edge cover 16 and are commonly formed. As illustrated in (b) of FIG. 1, the edge cover 16 may be formed in a position covering a side surface and the vicinity of a peripheral end portion of an upper face of the cathode electrode 4.

In the light-emitting element 2 according to the present embodiment, a red subpixel RP is formed of the red pixel cathode electrode 4R, the red pixel electron transport layer 6R, and the red pixel light-emitting layer 8R that have an island shape, and the hole transport layer 10 and the anode electrode 12 that are common. Similarly, a green subpixel GP is formed of the green pixel cathode electrode 4G, the green pixel electron transport layer 6G, and the green pixel light-emitting layer 8G that have an island shape, and the hole transport layer 10 and the anode electrode 12 that are common. Similarly, a blue subpixel BP is formed of the blue pixel cathode electrode 4B, the blue pixel electron transport layer 6B, and the blue pixel light-emitting layer 8B that have an island shape, and the hole transport layer 10 and the anode electrode 12 that are common.

In the present embodiment, the red pixel light-emitting layer 8R included in the red subpixel RP emits red light, the green pixel light-emitting layer 8G included in the green subpixel GP emits green light, and the blue pixel light-emitting layer 8B included in the blue subpixel BP emits blue light. In other words, the light-emitting element 2 includes a plurality of subpixels for each light emission wavelength of the light-emitting layer 8, and includes the cathode electrode 4, the electron transport layer 6, and the light-emitting layer 8 for each subpixel. Note that the light-emitting element 2 includes the hole transport layer 10 and the anode electrode 12 common to all of the subpixels.

Here, the blue light is light having the central wavelength of the light emission in a wavelength band from 400 nm to 500 nm. The green light is light having the central wavelength of the light emission in a wavelength band greater than 500 nm and smaller than or equal to 600 nm. The red light is light having the central wavelength of the light emission in a wavelength band greater than 600 nm and smaller than or equal to 780 nm.

In the light-emitting element 2 according to the present embodiment, one group including one red subpixel RP, one green subpixel GP, and one blue subpixel BP may be one pixel in the light-emitting element 2. In FIG. 1, only one pixel is illustrated, but in the present embodiment, the light-emitting element 2 may additionally include a plurality of pixels.

The cathode electrode 4 and the anode electrode 12 include conductive materials and are electrically connected to the electron transport layer 6 and the hole transport layer 10, respectively. Any one of the cathode electrode 4 and the anode electrode 12 is a transparent electrode. In the present embodiment, the anode electrode 12 is a transparent electrode, and, for example, ITO, IZO, AZO, or GZO may be used, and the anode electrode 12 may be film-formed by sputtering or the like. Further, any one of the cathode electrode 4 and the anode electrode 12 may include a metal material. In the present embodiment, the cathode electrode 4 includes a metal material. The metal material is preferably Al, Cu, Au, Ag, or the like having a high reflectance of visible light. The light-emitting element 2 can extract light from the electrode side provided with the transparent electrode. Therefore, in the present embodiment, the light-emitting element 2 can extract light from the anode electrode 12 side.

The light-emitting layer 8 is a layer that emits light due to the occurrence of recombination between electrons transported from the cathode electrode 4 and positive holes transported from the anode electrode 12. In the present embodiment, a quantum dot (semiconductor nanoparticle) layered in one to several layers is provided as a light-emitting material in each subpixel. As illustrated in (a) and (b) of FIG. 1, the light-emitting layer 8 includes a red quantum dot QR in the red pixel light-emitting layer 8R, a green quantum dot QG in the green pixel light-emitting layer 8G, and a blue quantum dot QB in the blue pixel light-emitting layer 8B. In other words, the light-emitting layer 8 includes quantum dots of a plurality of types, and includes quantum dots of the same type in the same subpixel.

The light-emitting layer 8 can be film-formed by separately patterning for each subpixel from a dispersion liquid in which quantum dots are dispersed in a solvent such as hexane or toluene using a spin coating method, an ink-jet method, or the like. The dispersion liquid may be mixed with a dispersion material such as thiol or amine.

The quantum dots QR, QG, and QB are a light-emitting material that has a valence band level (equal to an ionization potential) and a conduction band level (equal to an electron affinity), and emits light through recombination of positive holes in the valence band level with electrons in the conduction band level. Because light emitted from the quantum dots QR, QG, and QB has a narrower spectrum due to a quantum confinement effect, it is possible to obtain the emitted light with relatively deep chromaticity.

The quantum dots QR, QG, and QB may include one or a plurality of semiconductor materials selected from a group including, for example, Cd, S, Te, Se, Zn, In, N, P, As, Sb, Al, Ga, Pb, Si, Ge, Mg, and compounds thereof. Further, the quantum dots QR, QG, and QB may be a two-component core type, a three-component core type, a four-component core type, a core-shell type, or a core multi-shell type. Further, the quantum dots QR, QG, and QB may include doped nanoparticles or may include a composition gradient structure. In the present embodiment, the quantum dots QR, QG, and QB have a core-shell type structure including CdSe as a core and ZnS as a shell.

The electron transport layer 6 is a layer that transports electrons from the cathode electrode 4 to the light-emitting layer 8. The electron transport layer 6 may have a function of inhibiting transport of positive holes. The electron transport layer 6 includes materials different from each other in each of the red pixel electron transport layer 6R, the green pixel electron transport layer 6G, and the blue pixel electron transport layer 6B. The electron transport layer 6 may include, for example, ZnO, MgZnO, $TiO_2$, $Ta_2O_3$, $SrTiO_3$, or $Mg_xZn_{1-x}O$, or may include a plurality of materials among them for each subpixel. Here, $Mg_xZn_{1-x}O$ indicates a structure where Zn being a part of ZnO is replaced with Mg, and x indicates a ratio of Zn of ZnO replaced with Mg. ZnO has a property that the ionization potential and the electron affinity decrease as the ratio of Zn replaced with Mg is higher.

In the present embodiment, the electron transport layer 6 includes ZnO in the red pixel electron transport layer 6R, $Mg_xZn_{1-x}O$ in the green pixel electron transport layer 6G, and $Mg_yZn_{1-y}O$ in the blue pixel electron transport layer 6B. Here, in the present embodiment, $0<x<y<1$. Particularly, x and y preferably satisfy $0<x<y<0.5$. In the present embodiment, x is 0.15 and y is 0.3. The electron transport layer 6 may be film-formed for each subpixel by sputtering.

Note that, in terms of reducing a barrier of electron transport from the electron transport layer 6 to the light-emitting layer 8, the electron affinity of the electron transport layer 6 is preferably smaller, and thus the ratio of replacement with Mg is preferably higher. On the other hand, in terms of reducing a barrier of electron injection from the cathode electrode 4 to the electron transport layer 6, in terms of improving the electrical conductivity of the electron transport layer 6 itself, and in terms of manufacturing cost, the ratio of replacement with Mg is preferably lower.

The hole transport layer 10 is a layer that transports positive holes from the anode electrode 12 to the light-emitting layer 8. The hole transport layer 10 may have a function of inhibiting transport of electrons. The hole transport layer 10 may include, for example, PEDOT: PSS, PVK, TFB, or poly-TPD, or may include a plurality of materials among them. In the present embodiment, as illustrated in (b) of FIG. 1, the hole transport layer 10 has a layered structure in which a first hole transport layer 10a and a second hole transport layer 10b are sequentially layered from a lower layer. In the present embodiment, the first hole transport layer 10a includes PVK, and the second hole transport layer 10b includes PEDOT: PSS.

Figure 2:
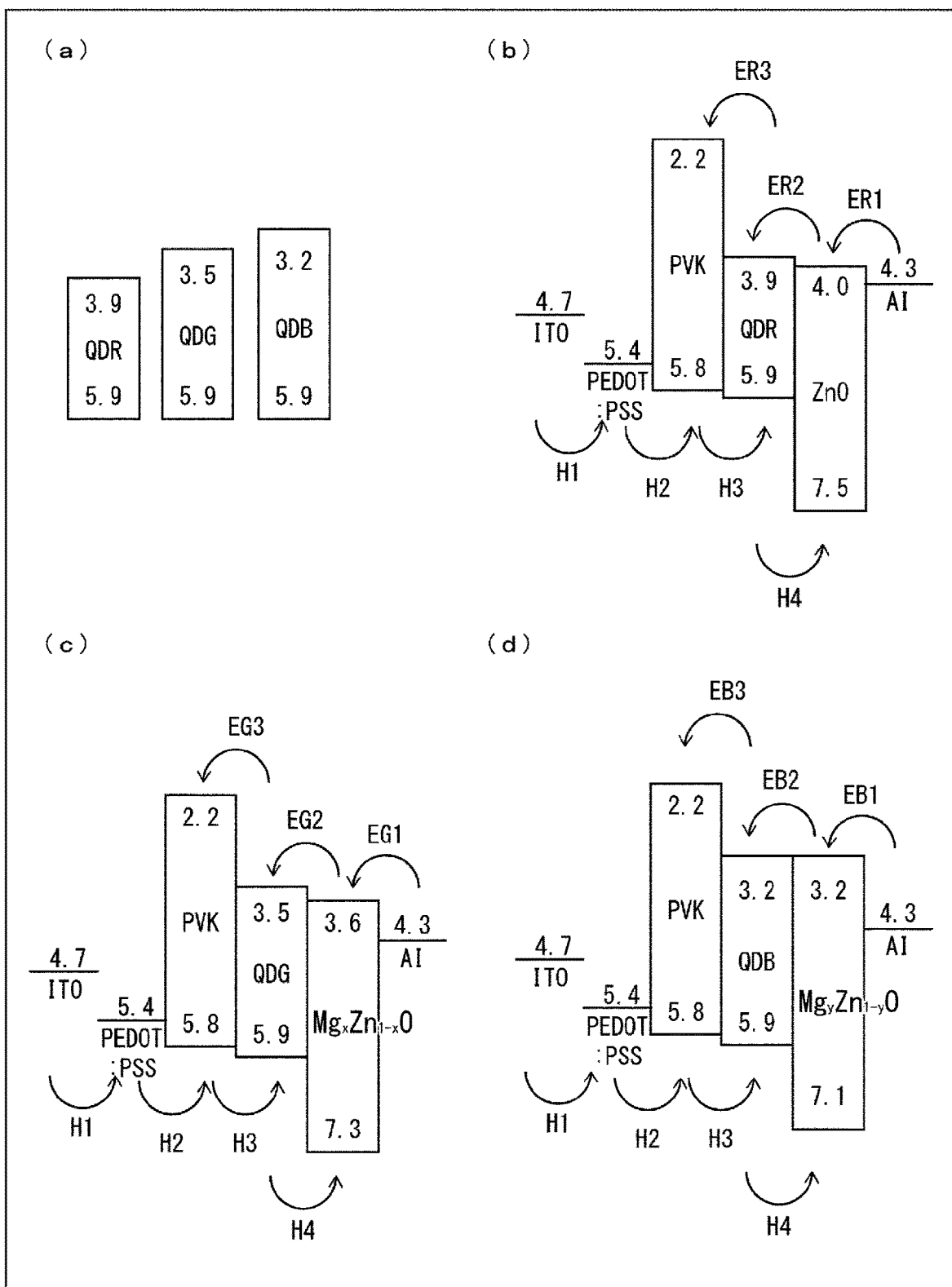
FIG. 2 includes energy diagrams illustrating, for each subpixel, an example of a Fermi level, an electron affinity, and an ionization potential in each layer of a light-emitting element according to the first embodiment of the disclosure.

FIG. 2 is an energy diagram illustrating an example of a Fermi level, an electron affinity, and an ionization potential in each layer of the light-emitting element 2 according to the present embodiment. (a) of FIG. 2 is an energy diagram illustrating an example of an electron affinity and an ionization potential in each of the red pixel light-emitting layer 8R, the green pixel light-emitting layer 8G, and the blue pixel light-emitting layer 8B from the left. (b), (c), and (d) of FIG. 2 are energy diagrams illustrating an example of a Fermi level, an electron affinity, and an ionization potential in each layer of the red subpixel RP, the green subpixel GP, and the blue subpixel BP. (b) to (d) of FIG. 2 each illustrate the energy diagram of the cathode electrode 4, the electron transport layer 6, the light-emitting layer 8, the first hole transport layer 10a, the second hole transport layer 10b, and the anode electrode 12 in each subpixel from the right to the left.

In the cathode electrode 4 and the anode electrode 12, a Fermi level of each of the electrodes is indicated in eV. An ionization potential of each layer with reference to the vacuum level is indicated in eV below the electron transport layer 6, the light-emitting layer 8, and the hole transport layer 10. An electron affinity of each layer with reference to the vacuum level is indicated in eV above the electron transport layer 6, the light-emitting layer 8, and the hole transport layer 10.

In the following description, both the ionization potential and the electron affinity are assumed to be based on the vacuum level when the ionization potential and the electron affinity are described simply in the present specification.

In general, the valence band level (equal to an ionization potential) of the quantum dots is substantially the same value in a case of the same material system, regardless of a wavelength of light emitted from the quantum dots. This is because a lower atomic number of the elements constituting the core of the quantum dots has a small closed shell orbit, and an atomic nucleus is less likely to be shielded by the closed shell orbit, and thus a valence electron is more likely to be affected by an electric field created by the atomic nucleus and tends to remain at a constant energy level. Therefore, the valence level is also constant regardless of the luminescent color of the quantum dots. For example, when comparing HgSe, CdSe, and ZnSe as the material of the core, Cd and even Zn have a smaller atomic number than Hg. Thus, in CdSe or ZnSe, the valence level is constant regardless of the luminescent color.

On the other hand, the conduction band level (equivalent to an electron affinity) of the quantum dots changes depending on a wavelength of light emitted from the quantum dots. Particularly, the conduction band level of the quantum dots has a deeper energy level as a wavelength of light emitted from the quantum dots is longer, and has a lower energy level as a wavelength of light emitted from the quantum dots is shorter. This is because the quantum dots with a smaller band gap have a deeper conduction band level.

For example, in the present embodiment, as illustrated in (a) of FIG. 2, the red pixel light-emitting layer 8R, the green pixel light-emitting layer 8G, and the blue pixel light-emitting layer 8B have an ionization potential of 5.9 eV, and also substantially have the same value among different subpixels. On the other hand, in the present embodiment, as illustrated in (a) of FIG. 2, the red pixel light-emitting layer 8R, the green pixel light-emitting layer 8G, and the blue pixel light-emitting layer 8B have an electron affinity of 3.9 eV, 3.5 eV and 3.2 eV, respectively.

In the present embodiment, as an example, a case in which the cathode electrode 4 is formed of Al and the anode electrode 12 is formed of ITO is illustrated in (b) to (d) of FIG. 2. In this case, the Fermi level of the cathode electrode 4 is 4.3 eV, and the Fermi level of the anode electrode 12 is 4.7 eV.

In the present embodiment, in the red subpixel RP, the red pixel electron transport layer 6R includes ZnO, and has, as illustrated in (b) of FIG. 2, an ionization potential of 7.5 eV and an electron affinity of 4.0 eV. In the green subpixel GP, the green pixel electron transport layer 6G includes $Mg_xZn_{1-x}O$, and has, as illustrated in (c) of FIG. 2, an ionization potential of 7.3 eV and an electron affinity of 3.6 eV. Further, in the blue subpixel BP, the blue pixel electron transport layer 6B includes $Mg_yZn_{1-y}O$, and has, as illustrated in (d) of FIG. 2 an ionization potential of 7.1 eV and an electron affinity of 3.2 eV.

In the present embodiment, the hole transport layer 10 is common in all the subpixels, the first hole transport layer 10a includes PVK, and the second hole transport layer 10b includes PEDOT: PSS. Thus, as illustrated in (b) to (d) of FIG. 2, the first hole transport layer 10a and the second hole transport layer 10b have an ionization potential of 5.8 eV and 5.4 eV, respectively. The first hole transport layer 10a has an electron affinity of 2.2 eV.

A light emission mechanism of the light-emitting device 1 according to the present embodiment will be described with reference to FIG. 1 and FIG. 2.

In the light-emitting device 1, when a potential difference is applied between the cathode electrode 4 and the anode electrode 12, the electrons from the cathode electrode 4 and the positive holes from the anode electrode 12 are injected toward the light-emitting layer 8. The electrons from the cathode electrode 4 reach the light-emitting layer 8 via the electron transport layer 6, as indicated by an arrow e– in (b) of FIG. 1. The positive holes from the anode electrode 12 reach the light-emitting layer 8 via the second hole transport layer 10b and the first hole transport layer 10a in order, as indicated by an arrow h+ in (b) of FIG. 1.

The positive holes and the electrons that have reached the light-emitting layer 8 are recombined at the quantum dots QR, QG, and QB in each of the subpixels to emit light. Light emitted from the quantum dots QR, QG, and QB, for example, may be reflected by the cathode electrode 4, which is a metal electrode, transmitted through the anode electrode 12, which is the transparent electrode, and radiated to the outside of the light-emitting device 1.

A state in which the positive holes and the electrons are transported in each layer of the light-emitting element 2 will be described with reference to (b) to (d) of FIG. 2.

In the light-emitting device 1, when a potential difference is generated between the cathode electrode 4 and the anode electrode 12, the positive holes are injected into the second hole transport layer 10b from the anode electrode 12, as indicated by an arrow H1 in (b) to (d) of FIG. 2. Similarly, the electrons are injected into the electron transport layer 6 in each of the subpixels from the cathode electrode 4, as indicated by arrows ER1, EG1, and EB1 in (b) to (d) of FIG. 2.

Here, for example, a barrier of the hole transport from a first layer to a second layer different from the first layer is indicated by energy obtained by subtracting the ionization potential of the first layer from the ionization potential of the second layer. Thus, a barrier of the hole injection indicated by the arrow H1 is 0.7 eV regardless of the type of subpixel.

Further, for example, a barrier of the electron transport from a first layer to a second layer different from the first layer is indicated by energy obtained by subtracting the electron affinity of the second layer from the electron affinity of the first layer. Thus, a barrier of the hole injection indicated by the arrows ER1, EG1, and EB1 is 0.3 eV, 0.7 eV, and 1.1 eV, respectively.

Next, as indicated by arrows H2 and H3 in (b) to (d)/of FIG. 2, the positive holes injected into the second hole transport layer 10b are transported to the light-emitting layer 8 in each of the subpixels via the first hole transport layer 10a. Here, because the first hole transport layer 10a is formed in common to all of the subpixels, a barrier of the hole transport indicated by the arrow H2 in (b) to (d) of FIG. 2 is 0.4 eV regardless of the type of subpixel. Further, since the ionization potential in the light-emitting layer 8 is substantially the same value among different subpixels, the barrier of the hole transport indicated by the arrow H3 in (b) to (d) of FIG. 2 is 0.1 eV regardless of the type of subpixel.

Similarly, as indicated by each of the arrows ER2, EG2, and EB2 in (b) to (d) of FIG. 2, the electrons injected into the electron transport layer 6 in each of the subpixels are transported to the light-emitting layer 8. Here, the barrier of the electron transport indicated by the arrow ER2 is 0.1 eV, the barrier of the electron transport indicated by the arrow EG2 is 0.1 eV, and there is substantially no barrier of the electron transport indicated by the arrow EB2.

Thus, the positive holes and the electrons transported to the light-emitting layer 8 are recombined at the quantum dots QR, QG, and QB.

Note that the barrier of the hole transport from the light-emitting layer 8 to the electron transport layer 6, as indicated by an arrow H4 is relatively large from 1.2 eV to 1.6 eV, as can be seen from FIG. 2. Thus, the recombination between the positive holes and the electrons in the light-emitting layer 8 occurs significantly more than the hole transport indicated by the arrow H4. Similarly, the barrier of the electron transport from the light-emitting layer 8 to the hole transport layer 10, as indicated by arrows ER3, EG3, and EB3, is relatively large from 1.0 eV to 1.7 eV, as can be seen from FIG. 2. Thus, the recombination between the positive holes and the electrons in the light-emitting layer 8 occurs significantly more than the electron transport indicated by the arrows ER3, EG3, and EB3.

In the light-emitting element 2 according to the present embodiment, the electron transport layer 6 suitable for the light-emitting layer 8 is formed for each subpixel. Particularly, in the present embodiment, the electron transport layer 6 has a smaller electron affinity in order of the red subpixel RP, the green subpixel GP, and the blue subpixel BP. Thus, while considering a point of reducing the barrier of the electron injection from the cathode electrode 4 to the electron transport layer 6, a point of improving the electrical conductivity of the electron transport layer 6 itself, and a point of manufacturing cost, the barrier of the electron transport from the electron transport layer 6 to the light-emitting layer 8 can be reduced. Furthermore, in the present embodiment, the barrier of the electron transport from the electron transport layer 6 to the light-emitting layer 8 is small, which is less than or equal to 0.5 eV, in all of the subpixels. Therefore, electrons from the cathode electrode 4 can be efficiently transported to the light-emitting layer 8.

Note that, in the light-emitting element 2 according to the present embodiment, a configuration in which the electron affinity of the electron transport layer 6 is approximately greater than the electron affinity of the light-emitting layer 8 in all of the subpixels is described, but the disclosure is not limited thereto. In the light-emitting element 2 according to the present embodiment, for example, in at least one subpixel, the electron affinity of the electron transport layer 6 may be the same value as the electron affinity of the light-emitting layer 8, or the electron affinity of the electron transport layer 6 may be smaller than the electron affinity of the light-emitting layer 8. Particularly, a difference between the electron affinity of the electron transport layer 6 and the electron affinity of the light-emitting layer 8 is preferably less than or equal to 0.5 eV. As described above, the configuration described above achieves an effect of improving the efficiency of the electron transport from the electron transport layer 6 to the light-emitting layer 8.

In the light-emitting element 2 according to the present embodiment, the hole transport layer 10 common to all of the subpixels is formed. However, since the ionization potential in the light-emitting layer 8 is substantially the same value between different subpixels, the barrier of the hole transport from the hole transport layer 10 to the light-emitting layer 8 does not change in any of the subpixels. Further, in the present embodiment, the barrier of the hole transport from the hole transport layer 10 to the light-emitting layer 8 is small, which is 0.1 eV, in all of the subpixels.

Therefore, it is not necessary to form the hole transport layer 10 for each subpixel, and the hole transport layer 10 common in all of the subpixels can be formed. Thus, the structure of the light-emitting element 2 can be simplified while maintaining a configuration in which the positive holes from the anode electrode 12 are efficiently transported to the light-emitting layer 8.

Note that, in the present embodiment, an "ionization potential is substantially the same value" indicates that a difference in ionization potential is small enough to provide a sufficiently small effect on the hole transport. Therefore, the ionization potential in the light-emitting layer 8 may not be exactly the same value between different subpixels. The "ionization potential is substantially the same value", for example, may allow for an error of 0.1 eV to 0.2 eV of the ionization potential due to, for example, a slight difference or a measurement error of the composition for each light emission wavelength of the quantum dots.

The light-emitting device 1 according to the present embodiment can achieve a device capable of color display by driving the light-emitting element 2 for each of the subpixels via the cathode electrode 4 by the TFT of the array substrate 3.

Figure 3:
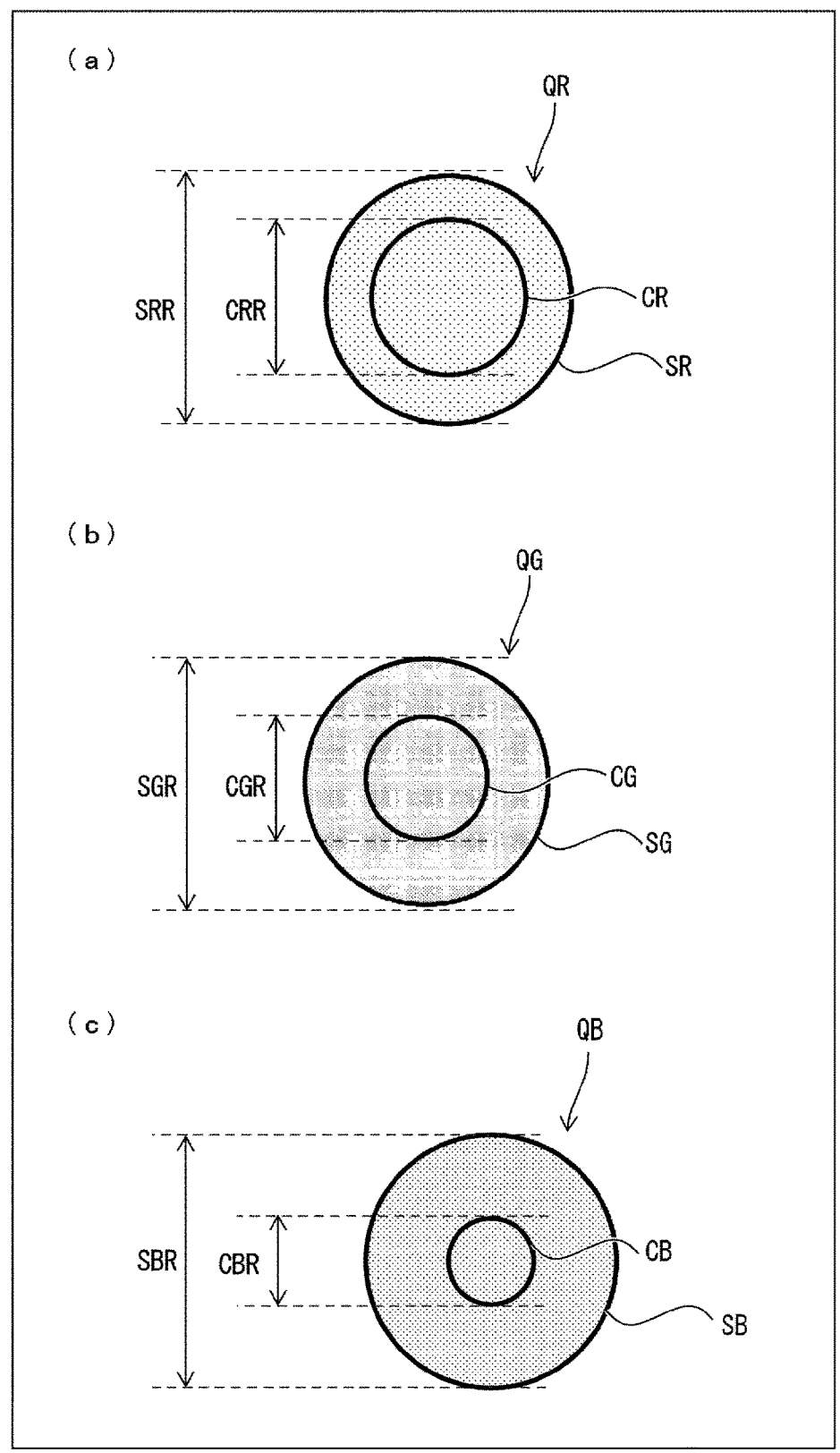
FIG. 3 is a schematic cross-sectional view of a quantum dot included in a light-emitting layer according to the first embodiment of the disclosure.

FIG. 3 is a schematic cross-sectional view illustrating each of the quantum dots QR, QG, and QB included in the light-emitting layer 8 of the light-emitting element 2 according to the present embodiment. (a), (b), and (c) of FIG. 3 illustrate the red quantum dot QR, the green quantum dot QG, and the blue quantum dot QB, respectively.

In the present embodiment, each of the red quantum dot QR, the green quantum dot QG, and the blue quantum dot QB has a core-shell type structure including a core and a shell covering the core. As illustrated in (a) of FIG. 3, the red quantum dot QR includes a red core Cr having a particle diameter CRR and a red shell Sr having a particle diameter SRR. Similarly, as illustrated in (b) of FIG. 3, the green quantum dot QG includes a green core CG having a particle diameter CGR and a green shell SG having a particle diameter SGR. Similarly, as illustrated in (c) of FIG. 3, the blue quantum dot QB includes a blue core CB having a particle diameter CBR and a blue shell SB having a particle diameter SBR.

As a feature of core-shell type quantum dots, a wavelength of light emitted from the quantum dots is proportional to a particle diameter of a core and is independent of a particle diameter of a shell. In the present embodiment, CRR>CGR>CBR, and SRR, SGR, and SBR are substantially the same. A particle diameter of a core-shell type shell can be designed by adjusting a film thickness of the shell.

Here, in the light-emitting element 2 according to the present embodiment, as illustrated in (b) of FIG. 1, the light-emitting layer 8 includes three layers of each of the quantum dots QR, QG, and QB in all of the subpixels.

In general, in a light-emitting element including a light-emitting layer in which quantum dots are layered, the quantum dots are preferably layered in two to three layers. This is because recombination of electrons and positive holes in the quantum dots occurs only in the vicinity of end faces on an anode electrode side and a cathode electrode side of the light-emitting layer, and tends to be less likely to occur in the vicinity of the center, and luminous efficiency decreases when the number of layers of the quantum dots in the light-emitting layer increases too much.

In the present embodiment, the particle diameters of the shells that are respective outermost particle diameters are substantially the same among the quantum dots QR, QG, and QB of types different from each other. Thus, when the same layer of each of the quantum dots QR, QG, and QB is layered in all of the subpixels, a film thickness of the light-emitting layer 8 can be formed constant in all of the subpixels. In other words, as illustrated in (b) of FIG. 1, a film thickness d8 of the light-emitting layer 8 is constant in all of the subpixels.

Thus, a film thickness of the electron transport layer 6 is also formed constant in all of the subpixels, and thus a total of the film thicknesses of the light-emitting layer 8 and the electron transport layer 6 can be made constant in all of the subpixels. In the present embodiment, as illustrated in (b) of FIG. 1, a film thickness d6 of the electron transport layer 6 is constant in all of the subpixels, and thus a total of d8 and d6 is constant in all of the subpixels.

Thus, by forming the electron transport layer 6 and the light-emitting layer 8 described above in combination with the cathode electrode 4 formed with the same film thickness in all of the subpixels, the surface on which the hole transport layer 10 is formed can be substantially flush. Therefore, formation of the hole transport layer 10 is facilitated, and the configuration of the light-emitting element 2 is further simplified.

Note that "particle diameters are the same" in the present specification means that the particle diameters do not completely match, and the particle diameters are substantially the same. "Particle diameters are substantially the same" means that the particle diameters of design values of quantum dots are the same when the quantum dots are formed, and includes variations in particle diameter as the result of formation. For example, the particle diameter of the quantum dots QR, QG, and QB may have an error of approximately 50%, and more preferably an error of 20%. As an error in particle diameter of quantum dots is small as much as possible, a narrower half value width of light emission spectrum of the quantum dots can be achieved, and a light-emitting element with high color purity can be achieved.

Note that a "particle diameter" of quantum dots is described in the present specification as an indicator. Here, the "particle diameter" is intended as a particle diameter assuming that the quantum dots are a sphere. However, in practice, there may be quantum dots that are not considered to be a sphere. However, even when quantum dots have slight distortion from a sphere, the quantum dots may function substantially equivalent to the quantum dots of a sphere. Thus, the "particle diameter" in the present specification refers to a particle diameter when converted to a sphere of the same volume.

Note that, as described above, the surface on which the hole transport layer 10 is formed is substantially flush. However, "flush" refers to a state in which unevenness is small to the extent that there is no difficulty in forming the hole transport layer 10, and does not mean that the surface is strictly on the same plane. Further, the film thicknesses of the electron transport layer 6 and the light-emitting layer 8 are substantially the same in all of the subpixels does not mean that the film thicknesses of the layers exactly match in all of the subpixels. For example, the film thicknesses of the electron transport layer 6 and the light-emitting layer 8 may not exactly match in all of the subpixels as long as the surface on which the hole transport layer 10 is formed is in a state in which unevenness is small to the extent that there is no difficulty in forming the hole transport layer 10.

Note that the outermost particle diameter of the quantum dots QR, QG, and QB may be 1 to 10 nm. Further, a film thickness of the electron transport layer 6, the light-emitting layer 8, and the hole transport layer 10 can adopt a known film thickness, but may be 1 to 50 nm. Particularly, a film thickness of the light-emitting layer 8 is preferably approximately several times the outermost particle diameter of the quantum dots QR, QG, and QB.

In the light-emitting element 2 according to the present embodiment, the hole transport layer 10 is formed in common to all of the subpixels for the sake of simplification of a formation step, but the disclosure is not limited thereto. The light-emitting element 2 according to the present embodiment may include, for example, the hole transport layer 10 common to at least a plurality of subpixels. Even with the configuration described above, the formation step of the hole transport layer 10 can be simplified as compared to a configuration in which the hole transport layer 10 is formed individually for all of the subpixels.

Figure 4:
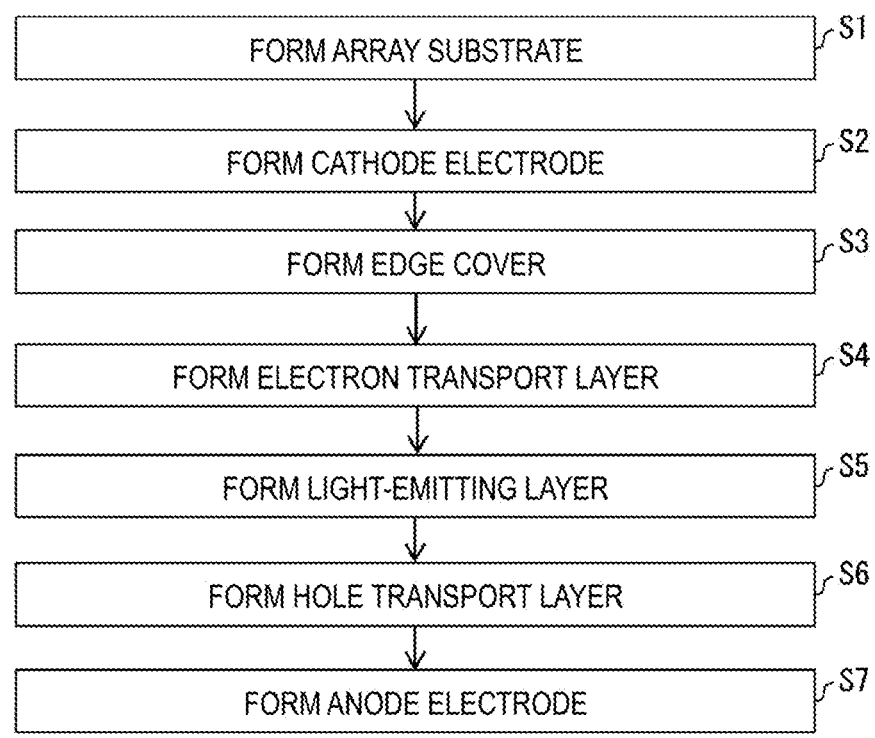
FIG. 4 is a flowchart illustrating a manufacturing method of the light-emitting device according to the first embodiment of the disclosure.

FIG. 4 is a flowchart illustrating a manufacturing method of the light-emitting device 1 according to the present embodiment. The manufacturing method of the light-emitting device 1 is described with reference to FIG. 4.

First, an array substrate is formed (step S1). Formation of the array substrate may be performed by forming a plurality of TFTs on the substrate to match a position of the subpixels. Next, the cathode electrode 4 is formed (step S2). After a cathode electrode material is film-formed by sputtering, the cathode electrode 4 may be formed for each subpixel by patterning the cathode electrode material to match a shape of the subpixel. Next, the edge cover 16 is formed (step S3). After the edge cover 16 is applied onto the array substrate 3 and the cathode electrode 4, the edge cover 16 may be obtained by patterning while leaving a position covering the side surface and the peripheral end portion of the cathode electrode 4 between adjacent cathode electrodes 4. Next, the electron transport layer 6 is formed (step S4). The electron transport layer 6 may be formed for each subpixel by separately patterning using an ink-jet method, vapor deposition using a mask, or patterning using photolithography. Next, the light-emitting layer 8 is formed (step S5). The light-emitting layer 8 may also be formed for each subpixel by separately patterning using an ink-jet method, vapor deposition using a mask, or patterning using photolithography. Next, the hole transport layer 10 is formed (step S6). The hole transport layer 10 may be applied and formed in common to all of the subpixels by an ink-jet method or the like. Finally, the anode electrode 12 is formed (step S7). The anode electrode 12 may be film-formed in common to all of the subpixels by sputtering or the like. As described above, the light-emitting element 2 is formed on the array substrate 3, and the light-emitting device 1 illustrated in FIG. 1 is obtained.

Second Embodiment

Figure 5:
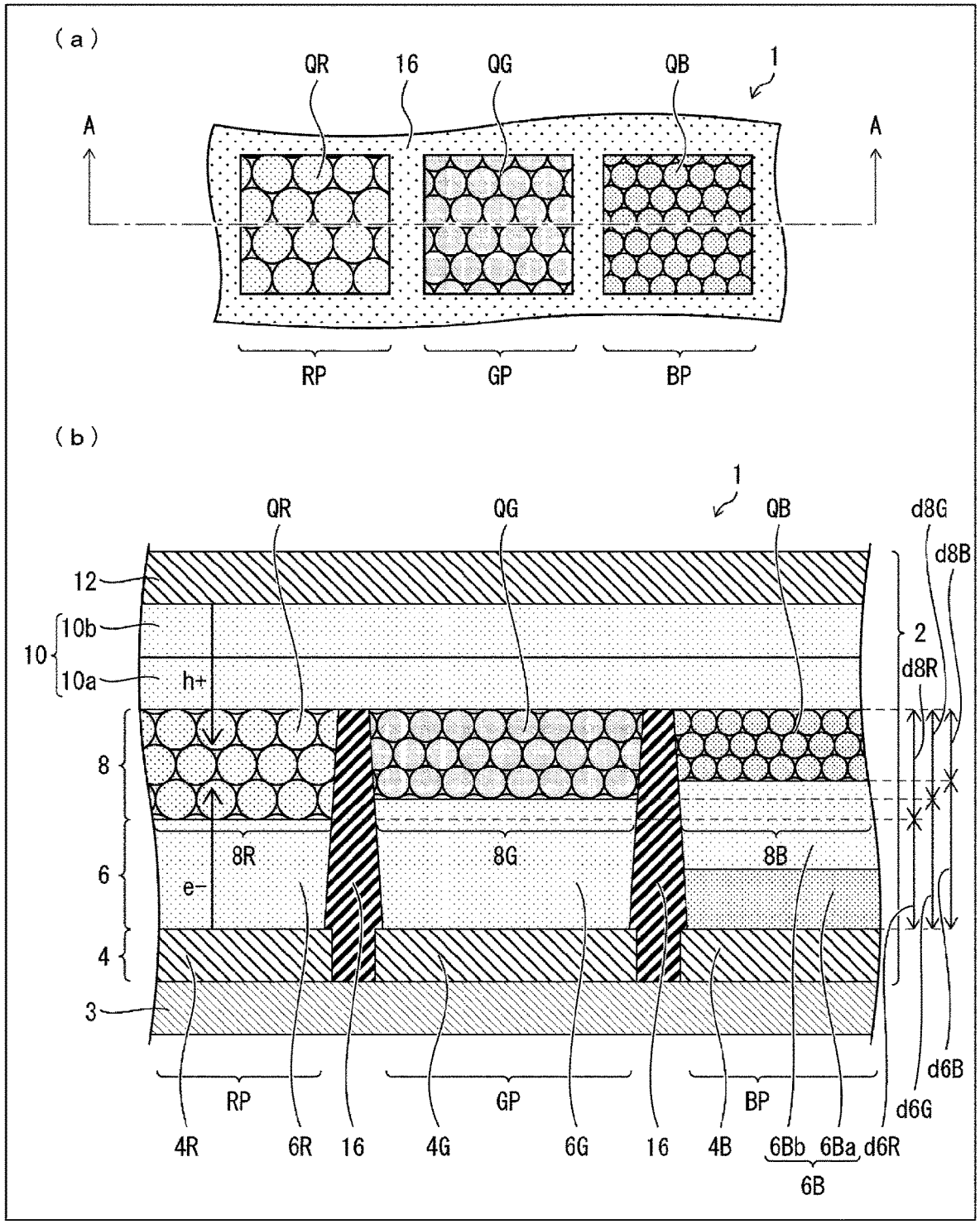
FIG. 5 includes a schematic top view and a schematic cross-sectional view of a light-emitting device according to a second embodiment of the disclosure.

FIG. 5 is a schematic diagram illustrating a light-emitting device 1 according to the present embodiment. (a) and (b) of FIG. 5 correspond to (a) and (b) of FIG. 1, respectively.

A light-emitting element 2 in the present embodiment is different from the light-emitting element 2 in the previous embodiment in that a blue pixel electron transport layer 6B includes a first blue pixel electron transport layer 6Ba and a second blue pixel electron transport layer 6Bb. The first blue pixel electron transport layer 6Ba and the second blue pixel electron transport layer 6Bb each include a different material, and the second blue pixel electron transport layer 6Bb is formed on an upper layer of the first blue pixel electron transport layer 6Ba.

The light-emitting element 2 in the present embodiment is also different from the light-emitting element 2 in the previous embodiment in that a red pixel electron transport layer 6R, a green pixel electron transport layer 6G, and the blue pixel electron transport layer 6B have film thicknesses different from each other. Similarly, in the present embodiment, a red pixel light-emitting layer 8R, a green pixel light-emitting layer 8G, and a blue pixel light-emitting layer 8B also have film thicknesses different from each other.

Except for the points described above, the light-emitting element 2 in the present embodiment may have the same configuration as that of the light-emitting element 2 in the previous embodiment, and the light-emitting element 2 in the present embodiment may be obtained by the same manufacturing method as the manufacturing method of the light-emitting element 2 in the previous embodiment. In this case, in step S4, the blue pixel electron transport layer 6B may be obtained by forming the first blue pixel electron transport layer 6Ba and the second blue pixel electron transport layer 6Bb being divided in this order.

Figure 6:
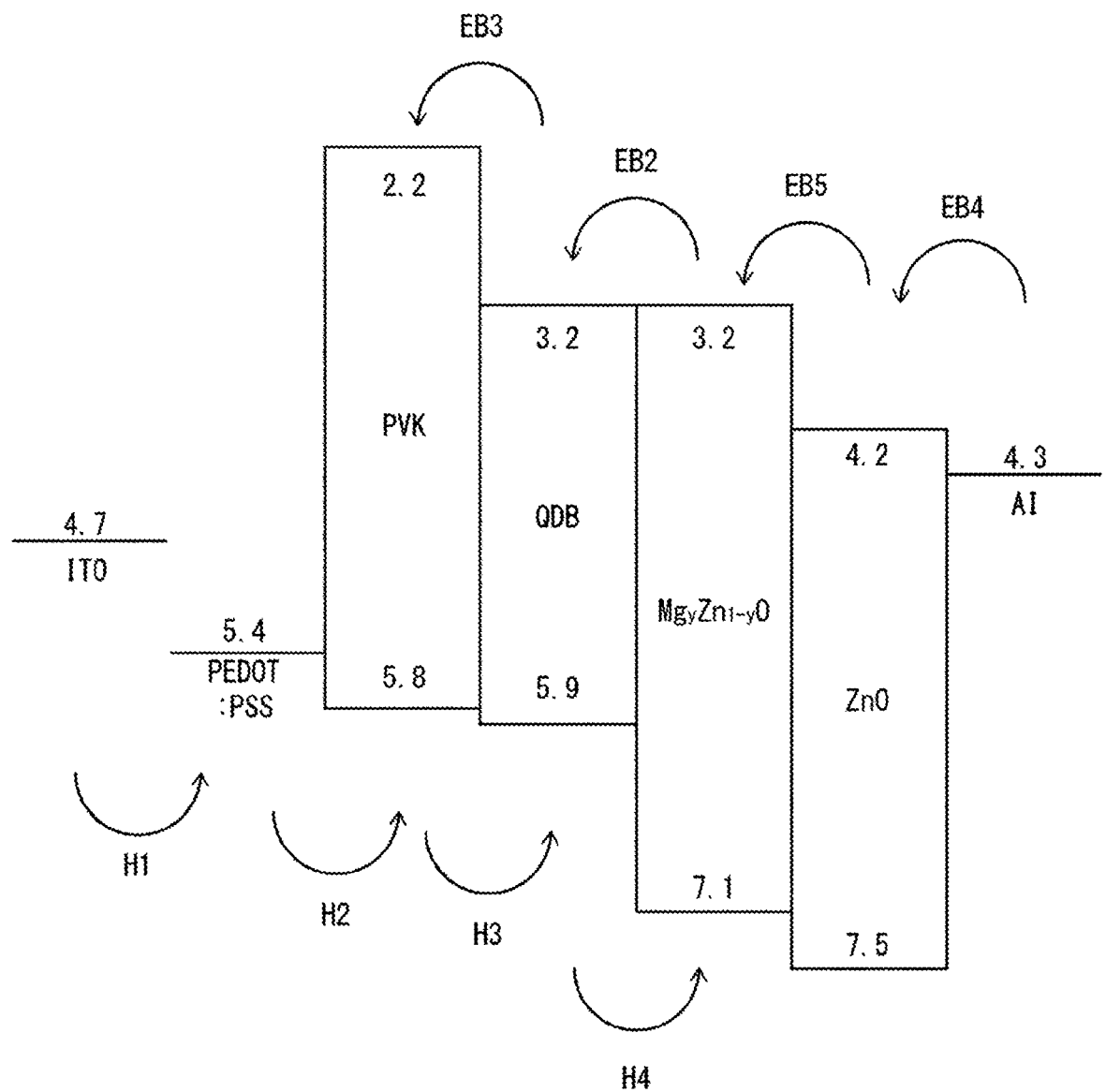
FIG. 6 is an energy diagram illustrating an example of a Fermi level, an electron affinity, and an ionization potential in each layer in a blue subpixel of a light-emitting element according to the second embodiment of the disclosure.

FIG. 6 is an energy diagram illustrating an example of a Fermi level, an electron affinity, and an ionization potential in each layer of a blue subpixel BP of the light-emitting element 2 according to the present embodiment. FIG. 6 illustrates an energy diagram of a blue pixel cathode electrode 4B, the first blue pixel electron transport layer 6Ba, the second blue pixel electron transport layer 6Bb, the blue pixel light-emitting layer 8B, a first hole transport layer 10a, a second hole transport layer 10b, and an anode electrode 12 from the right to the left.

In the present embodiment, the first blue pixel electron transport layer 6Ba includes ZnO, and the second blue pixel electron transport layer 6Bb includes $Mg_yZn_{1-y}O$. Here, y in the present embodiment may be the same value as y in the previous embodiment. Thus, as illustrated in FIG. 6, the first blue pixel electron transport layer 6Ba has an electron affinity of 4.2 eV and an ionization potential of 7.5 eV, and the second blue pixel electron transport layer 6Bb has an electron affinity of 3.2 eV and an ionization potential of 7.1 eV.

When a potential difference is generated between the blue pixel cathode electrode 4B and the anode electrode 12, electrons are injected into the first blue pixel electron transport layer 6Ba from the blue pixel cathode electrode 4B. At this time, a barrier of the electron injection indicated by an arrow EB4 in FIG. 6 is 0.1 eV. Next, as indicated by an arrow EB5 in FIG. 6, electrons are transported from the first blue pixel electron transport layer 6Ba to the second blue pixel electron transport layer 6Bb. At this time, a barrier of the electron transport indicated by the arrow EB5 in FIG. 6 is 1.0 eV. A barrier of the electron transport from the second blue pixel electron transport layer 6Bb to the blue pixel light-emitting layer 8B indicated by an arrow EB2 in FIG. 6 is substantially not present similarly to the barrier of the electron transport indicated by the arrow EB2 in (d) of FIG. 2. Note that the hole transport from the anode electrode 12 to the blue pixel light-emitting layer 8B occurs similarly to the previous embodiment.

The light-emitting element 2 according to the present embodiment can further reduce the barrier of the electron injection from the blue pixel cathode electrode 4B to the blue pixel electron transport layer 6B while maintaining a low barrier of the electron transport from the blue pixel electron transport layer 6B to the blue pixel light-emitting layer 8B. Thus, the light-emitting element 2 according to the present embodiment can further improve the efficiency of the electron transport from the cathode electrode 4 to the light-emitting layer 8.

In the present embodiment, an example is given of a configuration in which only the blue pixel electron transport layer 6B has a two-layer structure, but the disclosure is not limited thereto. Two or more layers including materials different from each other may also be included in the red pixel electron transport layer 6R or the green pixel electron transport layer 6G.

Figure 7:
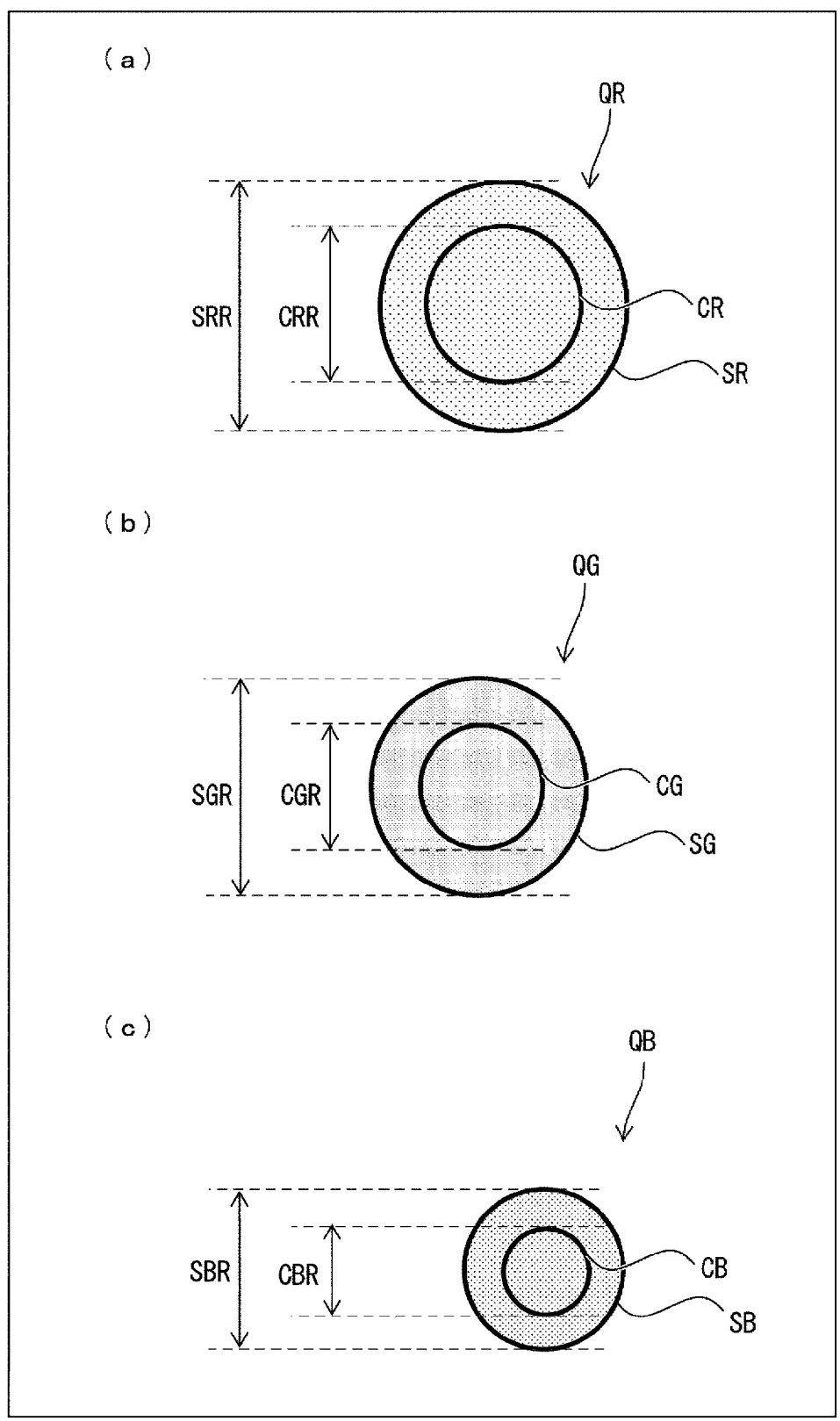
FIG. 7 is a schematic cross-sectional view of a quantum dot included in a light-emitting layer according to the second embodiment of the disclosure.

FIG. 7 is a schematic cross-sectional view illustrating each of quantum dots QR, QG, and QB included in the light-emitting layer 8 of the light-emitting element 2 according to the present embodiment. (a), (b), and (c) of FIG. 7 illustrate the red quantum dot QR, the green quantum dot QG, and the blue quantum dot QB, respectively. (a) to (c) of FIG. 7 correspond to (a) to (c) of FIG. 3, respectively. In FIG. 7, the configuration illustrated in FIG. 3 and corresponding to the configuration described above may be omitted from the description.

The quantum dots QR, QG, and QB in the present embodiment include a core-shell type structure similarly to the previous embodiment. However, in the present embodiment, since a film thickness of a shell is substantially constant between the quantum dots different from each other, SRR>SGR>SBR.

Thus, when the same layer of each of the quantum dots QR, QG, and QB is layered, for example, as illustrated in (b) of FIG. 5, three layers of each of the quantum dots QR, QG, and QB are layered, film thicknesses of the red pixel light-emitting layer 8R, the green pixel light-emitting layer 8G, and the blue pixel light-emitting layer 8B are different from each other due to a difference in particle diameter of the shell. When it is assumed that the film thickness of the red pixel light-emitting layer 8R is d8R, the film thickness of the green pixel light-emitting layer 8G is d8G, and the film thickness of the blue pixel light-emitting layer 8B is d8B, d8R>d8G>d8B.

Here, in the light-emitting element 2 according to the present embodiment, a total of the film thicknesses of the light-emitting layer 8 and the electron transport layer 6 is constant in all of the subpixels similarly to the light-emitting element 2 according to the previous embodiment. Since the film thickness of the light-emitting layer 8 is different between the subpixels different from each other, the film thickness of the electron transport layer 6 is also different between the subpixels different from each other. Particularly, when it is assumed that the film thickness of the red pixel electron transport layer 6R is d6R, the film thickness of the green pixel electron transport layer 6G is d6G, and the film thickness of the blue pixel electron transport layer 6B is d6B, d6R<d6G<d6B. The film thickness of the electron transport layer 6 can be easily set to be different between the subpixels different from each other by adjusting the film thickness to be film-formed.

Therefore, in the present embodiment, even when the film thickness of the light-emitting layer 8 is different between the subpixels different from each other, the surface on which the hole transport layer 10 is formed can be substantially flush. Therefore, formation of the hole transport layer 10 is facilitated, and the configuration of the light-emitting element 2 is further simplified. Furthermore, in the present embodiment, since the film thickness of the shell is substantially constant between the quantum dots different from each other, it is not necessary to individually design the film thickness of the shell, and it is possible to simplify the step of manufacturing a solution of the quantum dots.

Third Embodiment

Figure 8:
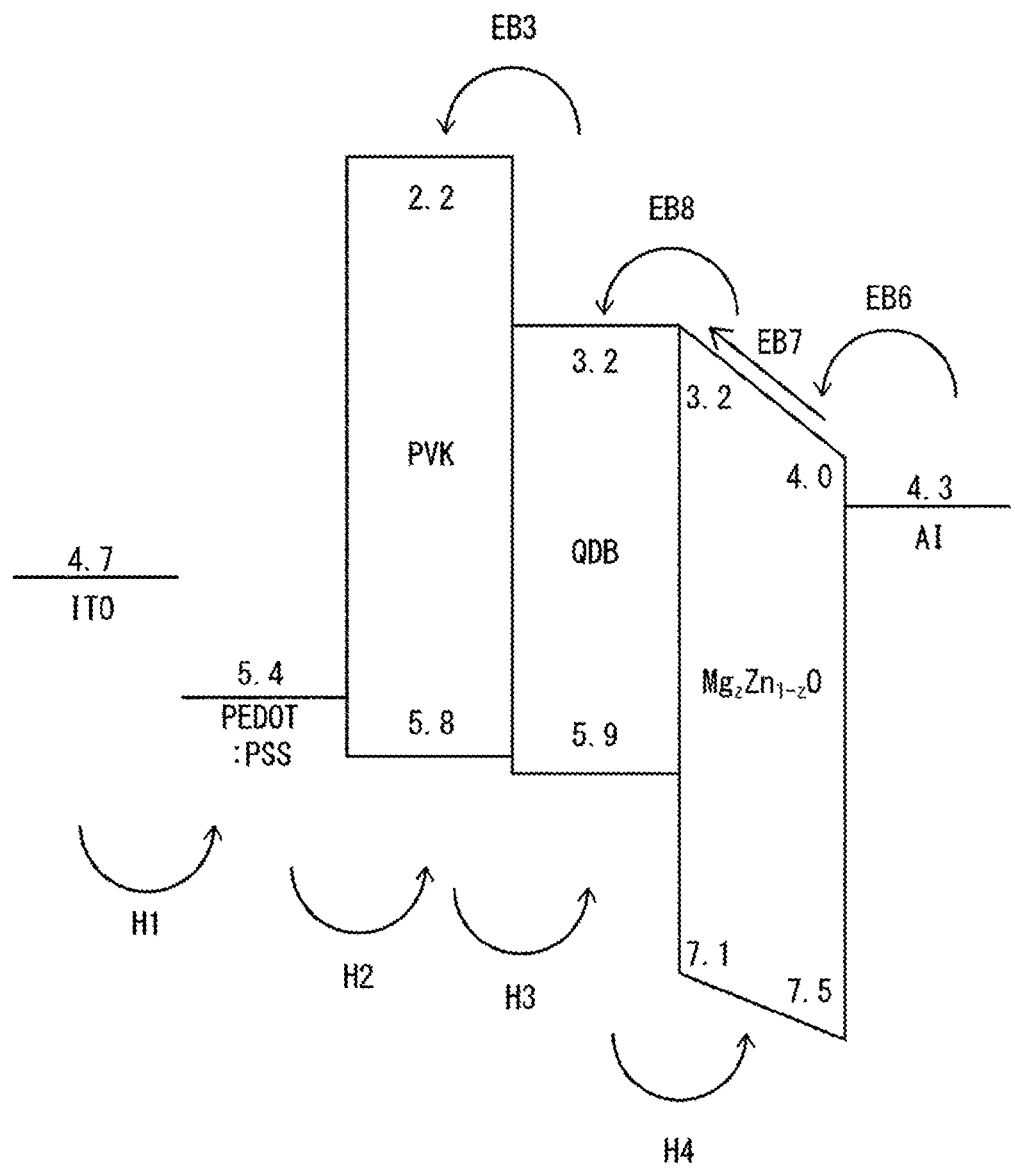
FIG. 8 is an energy diagram illustrating an example of a Fermi level, an electron affinity, and an ionization potential in each layer in a blue subpixel of a light-emitting element according to a third embodiment of the disclosure.

FIG. 8 is an energy diagram illustrating an example of a Fermi level, an electron affinity, and an ionization potential in each layer of a blue subpixel BP of a light-emitting element 2 according to the present embodiment. FIG. 8 illustrates an energy diagram of a blue pixel cathode electrode 4B, a blue pixel electron transport layer 6B, a blue pixel light-emitting layer 8B, a first hole transport layer 10a, a second hole transport layer 10b, and an anode electrode 12 from the right to the left.

The light-emitting device 1 according to the present embodiment may have the same configuration as that of the light-emitting device 1 illustrated in FIG. 1 except that a material included in the blue pixel electron transport layer 6B is different. In the present embodiment, the blue pixel electron transport layer 6B includes $Mg_zZn_{1-z}O$. Here, z indicates a percentage of Zn of ZnO replaced with Mg, and $0 \leq z \leq 1$.

Here, in the present embodiment, the blue pixel electron transport layer 6B has a structure in which Zn of ZnO is gradually replaced with Mg from an end face on the blue pixel cathode electrode 4B side to an end face on the blue pixel light-emitting layer 8B side. In other words, in the blue pixel electron transport layer 6B, a value of z simply increases to a certain constant from 0 to less than 1 from the end face on the blue pixel cathode electrode 4B side to the end face on the blue pixel light-emitting layer 8B side.

Therefore, as illustrated in FIG. 8, the electron affinity and the ionization potential of the blue pixel electron transport layer 6B gradually decrease from the end face on the blue pixel cathode electrode 4B side to the end face on the blue pixel light-emitting layer 8B side. As illustrated in FIG. 8, the blue pixel electron transport layer 6B has an electron affinity of 4.0 eV and an ionization potential of 7.5 eV at the end face on the blue pixel cathode electrode 4B side. Furthermore, the blue pixel electron transport layer 6B has an electron affinity of 3.2 eV and an ionization potential of 7.1 eV at the end face on the blue pixel light-emitting layer 8B side.

When a potential difference is generated between the blue pixel cathode electrode 4B and the anode electrode 12, electrons are injected into the blue pixel electron transport layer 6B from the blue pixel cathode electrode 4B. At this time, a barrier of the electron injection indicated by an arrow EB6 in FIG. 8 is 0.3 eV. Next, as indicated by an arrow EB7 in FIG. 8, electrons are transported from the blue pixel cathode electrode 4B side to the blue pixel light-emitting layer 8B side in the blue pixel electron transport layer 6B.

When the electron affinity in the blue pixel electron transport layer 6B decreases during electron transport in the blue pixel electron transport layer 6B, the electron affinity gradually decreases, and thus the barrier of the electron transport in the blue pixel electron transport layer 6B is small. Next, as indicated by an arrow EB8 in FIG. 8, electrons are transported from the blue pixel electron transport layer 6B to the blue pixel light-emitting layer 8B. At this time, there is substantially no barrier of the electron transport indicated by the arrow EB8 in FIG. 68. Note that the hole transport from the anode electrode 12 to the blue pixel light-emitting layer 8B occurs similarly to the previous embodiment.

Also, in the present embodiment, the barrier of the electron transport from the blue pixel electron transport layer 6B to the blue pixel light-emitting layer 8B is small. Particularly, a minimum difference in electron affinity between the blue pixel electron transport layer 6B and the blue pixel light-emitting layer 8B is less than or equal to 0.5 eV. Thus, also, in the light-emitting element 2 according to the present embodiment, the efficiency of the electron transport is maintained.

Furthermore, in the present embodiment, the barrier of the electron injection from the blue pixel cathode electrode 4B to the blue pixel electron transport layer 6B can be reduced while reducing the barrier of the electron transport from the blue pixel electron transport layer 6B to the blue pixel light-emitting layer 8B. Thus, the efficiency of the electron injection can be further improved in the light-emitting element 2 according to the present embodiment.

In the present embodiment, an example is given of a configuration in which only the blue pixel electron transport layer 6B has a structure in which Zn of ZnO is gradually replaced with Mg from the end face on the blue pixel cathode electrode 4B side to the end face on the blue pixel light-emitting layer 8B side. However, the disclosure is not limited thereto. In the present embodiment, the red pixel electron transport layer 6R or the green pixel electron transport layer 6G may have a similar structure.

Here, the electron affinity of the green pixel light-emitting layer 8G is greater than the electron affinity of the blue pixel light-emitting layer 8B, and the electron affinity of the red pixel light-emitting layer 8R is even greater than the electron affinity of the green pixel light-emitting layer 8G. Therefore, the replacement ratio of Zn on the end face of the green pixel electron transport layer 6G on the green pixel light-emitting layer 8G side is preferably lower than the replacement ratio of Zn on the end face of the blue pixel electron transport layer 6B on the blue pixel light-emitting layer 8B side. Furthermore, the replacement ratio of Zn on the end face of the red pixel electron transport layer 6R on the red pixel light-emitting layer 8R side is preferably even lower than the replacement ratio of Zn on the end face of the green pixel electron transport layer 6G on the green pixel light-emitting layer 8G side.

The light-emitting element 2 in the present embodiment may be obtained by the same manufacturing method as the manufacturing method of the light-emitting element 2 in the previous embodiment. In this case, in step S4, the blue pixel electron transport layer 6B may be film-formed by gradually increasing the output of the sputtering apparatus that film-forms MgO while operating the sputtering apparatus that film-forms the ZnO.

Fourth Embodiment

Figure 9:
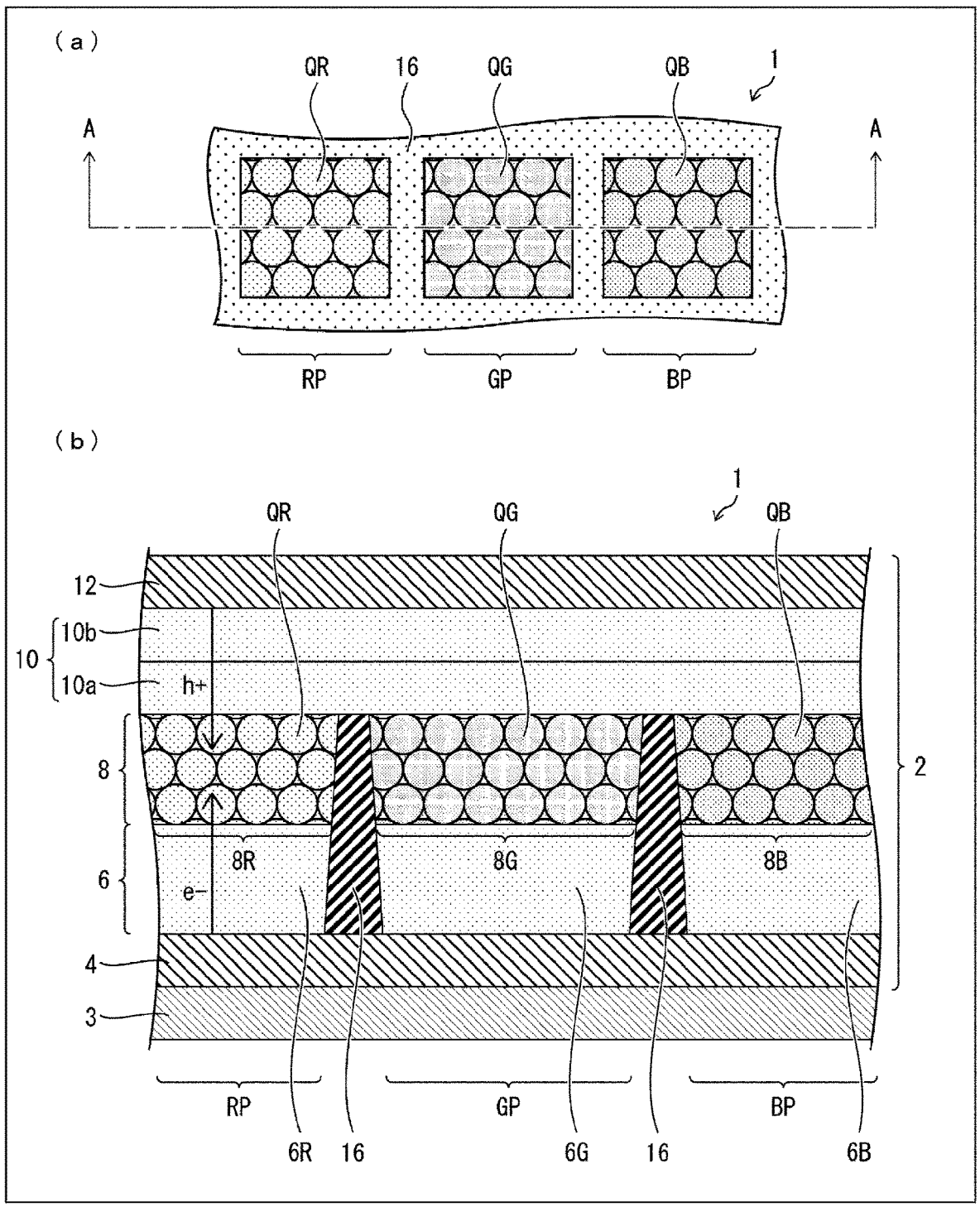
FIG. 9 includes a schematic top view and a schematic cross-sectional view of a light-emitting device according to a fourth embodiment of the disclosure.

FIG. 9 is a schematic diagram illustrating a light-emitting device 1 according to the present embodiment. (a) and (b) of FIG. 9 correspond to (a) and (b) of FIG. 1, respectively.

A configuration of a light-emitting element 2 in the present embodiment is different from that of the light-emitting element 2 according to the first embodiment only in that a cathode electrode 4 is formed in common to all of the subpixels. The light-emitting device 1 according to the present embodiment may be obtained by the same manufacturing method as the manufacturing method of the light-emitting device 1 according to the first embodiment. In this case, in step S2, patterning of the cathode electrode 4 after film formation is omitted. Further, in step S3, an edge cover 16 is formed directly on the cathode electrode 4.

The light-emitting element 2 in the present embodiment can simultaneously drive all subpixels including a red subpixel RP, a green subpixel GP, and a blue subpixel BP. Thus, the light-emitting element 2 can form white light by simultaneously causing all of the subpixels to emit light. The light-emitting device 1 including the light-emitting element 2 in the present embodiment can be used as a white light-emitting device that emits white light, such as a white light illumination unit or a white backlight unit, for example.

Fifth Embodiment

Figure 10:
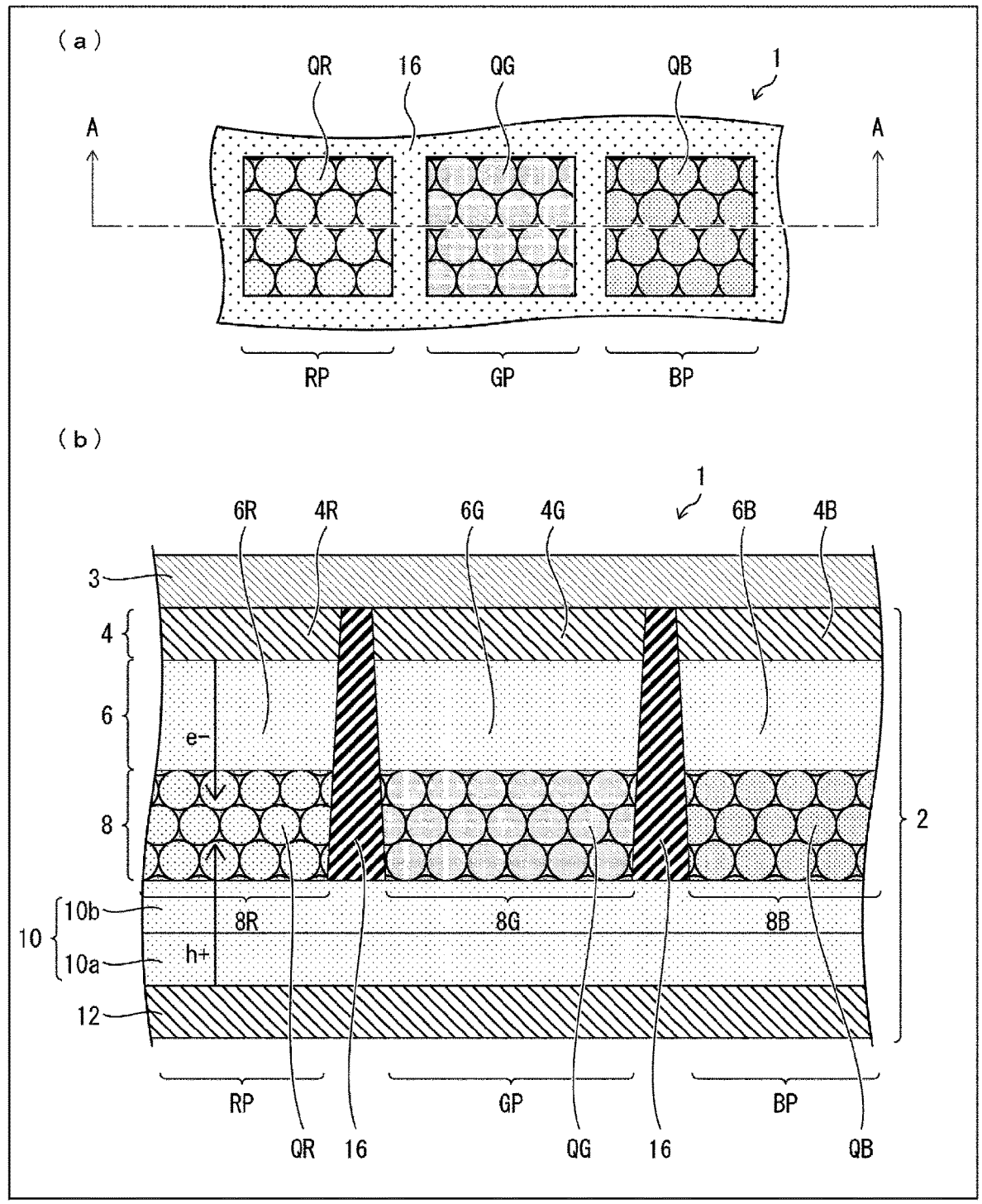
FIG. 10 includes a schematic top view and a schematic cross-sectional view of a light-emitting device according to a fifth embodiment of the disclosure.

FIG. 10 is a schematic diagram illustrating a light-emitting device 1 according to the present embodiment. (a) and (b) of FIG. 10 correspond to (a) and (b) of FIG. 1, respectively.

A configuration of the light-emitting device 1 according to the present embodiment is different from that of the light-emitting device 1 according to the first embodiment in that each layer up to an array substrate 3 is sequentially layered from a lower layer on an anode electrode 12, and an edge cover 16 is provided directly on a hole transport layer 10.

The light-emitting device 1 according to the present embodiment may be obtained by a manufacturing method in which the manufacturing step of the light-emitting device 1 according to the first embodiment illustrated in FIG. 4 is replaced as appropriate. For example, the light-emitting device 1 according to the present embodiment may be obtained by performing steps S6, S3, S5, S4, S2, and S1 in order from step S7. Here, in step S1, the array substrate 3 may be formed directly on an upper face of a light-emitting element 2, or the array substrate 3 manufactured on another substrate may be mounted on the upper face of the light-emitting element 2.

Figure 11:
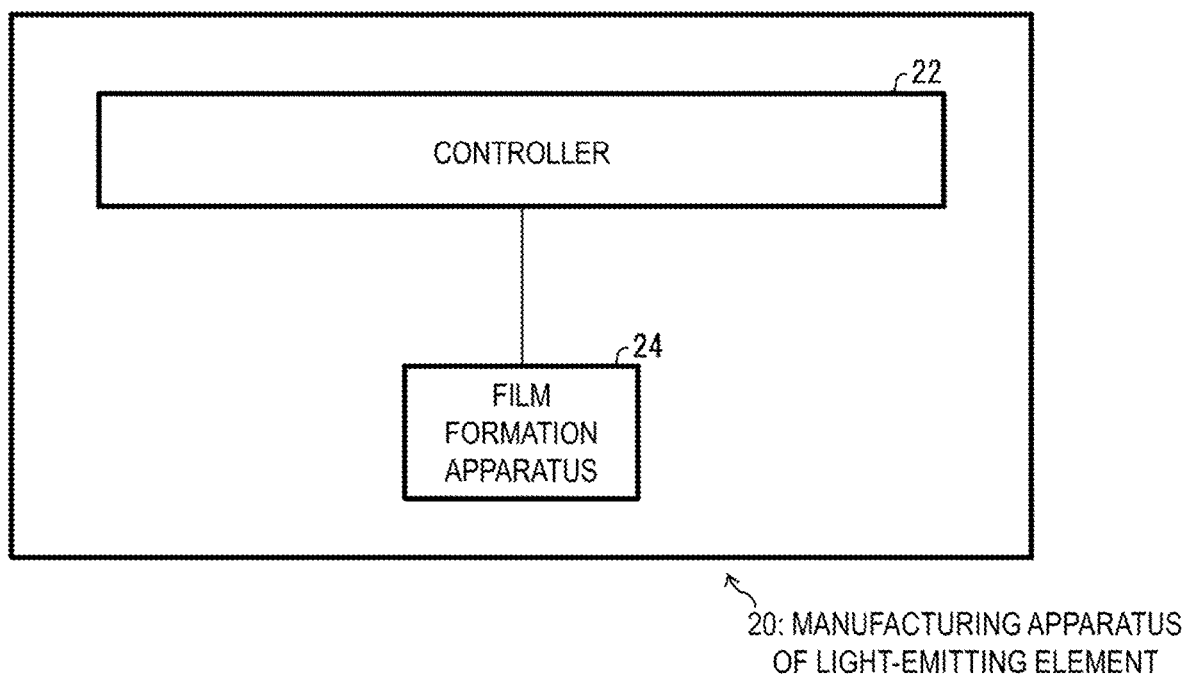
FIG. 11 is a block diagram illustrating a manufacturing apparatus of a light-emitting element according to each of the embodiments of the disclosure.

FIG. 11 is a block diagram illustrating a manufacturing apparatus 20 of a light-emitting element according to each of the embodiments described above. The manufacturing apparatus 20 of a light-emitting element may include a controller 22 and a film formation apparatus 24. The controller 22 controls the film formation apparatus 24. The film formation apparatus 24 film-forms each layer of the light-emitting element 2.

Supplement

A light-emitting element according to aspect 1 includes: a cathode electrode; an anode electrode; a light-emitting layer between the cathode electrode and the anode electrode; an electron transport layer between the light-emitting layer and the cathode electrode; and a hole transport layer between the light-emitting layer and the anode electrode, and the light-emitting element further includes a plurality of subpixels for each light emission wavelength of the light-emitting layer, the light-emitting layer and the electron transport layer for each of the plurality of subpixels, and the hole transport layer common to at least the plurality of subpixels.

In aspect 2, each of the plurality of subpixels includes a red subpixel that emits red light from the light-emitting layer, a green subpixel that emits green light from the light-emitting layer, and a blue subpixel that emits blue light from the light-emitting layer.

In aspect 3, an electron affinity of the electron transport layer is reduced in order of the red subpixel, the green subpixel, and the blue subpixel.

In aspect 4, an ionization potential of the light-emitting layer in at least the plurality of subpixels is substantially an identical value.

In aspect 5, a minimum difference between an electron affinity of the electron transport layer and an electron affinity of the light-emitting layer in each of the plurality of subpixels is less than or equal to 0.5 eV.

In aspect 6, the electron transport layer includes a plurality of layers including materials different from each other in at least one of the plurality of subpixels.

In aspect 7, an electron affinity gradually decreases from an end face on the cathode electrode side to an end face on the light-emitting layer side in the electron transport layer in at least one of the plurality of subpixels.

In aspect 8, a total of film thicknesses of the light-emitting layer and the electron transport layer is constant in all of the plurality of subpixels.

In aspect 9, each film thickness of the light-emitting layer and the electron transport layer is constant in all of the plurality of subpixels.

In aspect 10, each film thickness of the light-emitting layer and the electron transport layer in at least one of the plurality of subpixels is different from each film thickness of the light-emitting layer and the electron transport layer in another of the plurality of subpixels.

In aspect 11, the light-emitting layer includes a layer of quantum dots of a plurality of types that emit light at wavelengths different from each other, and includes the quantum dots of an identical type in each of the plurality of subpixels being identical.

In aspect 12, an outermost particle diameter is substantially identical between the quantum dots of types different from each other.

The light-emitting device according to aspect 13 includes the light-emitting element in any of the above-described aspects.

In aspect 14, a light-emitting device further includes an array substrate including a plurality of TFTs electrically connected to the cathode electrode, the light-emitting element includes the cathode electrode for each of the plurality of subpixels and the anode electrode common to all of the plurality of subpixels, and the light-emitting element is driven for each of the plurality of subpixels via the cathode electrode.

In aspect 15, the light-emitting element includes the cathode electrode common to all of the plurality of subpixels and the anode electrode common to all of the plurality of subpixels.

In aspect 16, the light-emitting device is a white light-emitting device that forms white light by simultaneously causing all of the plurality of subpixels to emit light.

A manufacturing method of a light-emitting element in aspect 17 that includes: a cathode electrode; an anode electrode; a light-emitting layer between the cathode electrode and the anode electrode; an electron transport layer between the light-emitting layer and the cathode electrode; and a hole transport layer between the light-emitting layer and the anode electrode, and includes a plurality of subpixels for each light emission wavelength of the light-emitting layer is a manufacturing method of a light-emitting element including: a light-emitting layer formation step of forming the light-emitting layer for each of the plurality of subpixels; an electron transport layer formation step of forming the electron transport layer for each of the plurality of subpixels; and a hole transport layer formation step of forming the hole transport layer common to at least the plurality of subpixels.

In aspect 18, the light-emitting layer formation step is performed after the electron transport layer formation step, and the hole transport layer formation step is performed after the light-emitting layer formation step.

In aspect 19, the light-emitting layer formation step is performed after the hole transport layer formation step, and the electron transport layer formation step is performed after the light-emitting layer formation step.

A manufacturing apparatus of a light-emitting element in aspect 20 that includes: a cathode electrode; an anode electrode; a light-emitting layer between the cathode electrode and the anode electrode; an electron transport layer between the light-emitting layer and the cathode electrode; and a hole transport layer between the light-emitting layer and the anode electrode, and includes a plurality of subpixels for each light emission wavelength of the light-emitting layer is a manufacturing apparatus of a light-emitting element including a film formation apparatus that forms the light-emitting layer and the electron transport layer for each of the plurality of subpixels, and forms the hole transport layer common to at least the plurality of subpixels.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A light-emitting element comprising:
a plurality of cathode electrodes;
an anode electrode;
a plurality of light-emitting layers between the plurality of cathode electrodes and the anode electrode;
a plurality of electron transport layers between the plurality of light-emitting layers and the plurality of cathode electrodes; and
a hole transport layer between the plurality of light-emitting layers and the anode electrode, wherein:
the light-emitting element comprises a plurality of subpixels configured to output a plurality of lights of a plurality of light emission wavelengths of the plurality of light-emitting layers, respectively;
each of the plurality of subpixels includes a corresponding one of the plurality of cathode electrodes, a corresponding one of the plurality of electron transport layers, and a corresponding one of the plurality of light-emitting layers;
the hole transport layer and the anode electrode are common to the plurality of subpixels; and
each of the plurality of electron transport layers includes a plurality of layers including materials different from each other in at least one of the plurality of subpixels.

2. The light-emitting element according to claim 1, wherein each of the plurality of subpixels further includes a red subpixel that emits red light from the corresponding one of the plurality of light-emitting layers, a green subpixel that emits green light from the corresponding one of the plurality of light-emitting layers, and a blue subpixel that emits blue light from the corresponding one of the plurality of light-emitting layers.

3. The light-emitting element according to claim 2, wherein a total film thickness of the plurality of light-emitting layers and the plurality of electron transport layers is constant in the plurality of subpixels.

4. The light-emitting element according to claim 3, wherein each film thickness of the plurality of light-emitting layers and the plurality of electron transport layers is constant in the plurality of subpixels.

5. The light-emitting element according to claim 3, wherein each film thickness of the plurality of light-emitting layers and the plurality of electron transport layers in at least one of the plurality of subpixels is different from another of the plurality of subpixels.

6. The light-emitting element according to claim 1, wherein each of the plurality of light-emitting layers includes a layer of quantum dots of a plurality of types that emit light at wavelengths different from each other, and includes the quantum dots of an identical type in each of the plurality of subpixels that is identical.

7. The light-emitting element according to claim 6, wherein an outermost particle diameter is substantially identical between the quantum dots of different types.

8. A light-emitting device comprising:
the light-emitting element according to claim 1.

9. The light-emitting device according to claim 8, further comprising:
an array substrate including a plurality of TFTs electrically connected to the plurality of cathode electrodes, wherein the light-emitting element includes the plurality of cathode electrodes for each of the plurality of subpixels and the anode electrode is common to the plurality of subpixels, and
the light-emitting element is driven for each of the plurality of subpixels via the plurality of cathode electrodes.

10. The light-emitting device according to claim 8, wherein the light-emitting element includes the cathode electrode common to the plurality of subpixels and the anode electrode common to the plurality of subpixels.

11. A light-emitting element comprising:
a plurality of cathode electrodes;
an anode electrode;
a plurality of light-emitting layers between the plurality of cathode electrodes and the anode electrode;
a plurality of electron transport layers between the plurality of light-emitting layers and the plurality of cathode electrodes; and
a hole transport layer between the plurality of light-emitting layers and the anode electrode, wherein:
the light-emitting element comprises a plurality of subpixels configured to output a plurality of lights of a plurality of light emission wavelengths of the plurality of light-emitting layers, respectively;
each of the plurality of subpixels includes a corresponding one of the plurality of cathode electrodes, a corresponding one of the plurality of electron transport layers, and a corresponding one of the plurality of light-emitting layers;
the hole transport layer and the anode electrode are common to the plurality of subpixels;
a total film thickness of the plurality of light-emitting layers and the plurality of electron transport layers is constant in the plurality of subpixels; and
each film thickness of the plurality of light-emitting layers and the plurality of electron transport layers in at least one of the plurality of subpixels is different from another of the plurality of subpixels.

12. The light-emitting element according to claim 11, wherein each of the plurality of subpixels further includes a red subpixel that emits red light from the corresponding one of the plurality of light-emitting layers, a green subpixel that emits green light from the corresponding one of the plurality of light-emitting layers, and a blue subpixel that emits blue light from the corresponding one of the plurality of light-emitting layers.

13. The light-emitting element according to claim 11, wherein each of the plurality of electron transport layers includes a plurality of layers including materials different from each other in at least one of the plurality of subpixels.

14. The light-emitting element according to claim 11, wherein each film thickness of the plurality of light-emitting layers and the plurality of electron transport layers is constant in the plurality of subpixels.

15. The light-emitting element according to claim 11, wherein each of the plurality of light-emitting layers includes a layer of quantum dots of a plurality of types that emit light at wavelengths different from each other, and includes the quantum dots of an identical type in each of the plurality of subpixels that is identical.

16. The light-emitting element according to claim 15, wherein an outermost particle diameter is substantially identical between the quantum dots of different types.

17. A light-emitting device comprising:
the light-emitting element according to claim 11.

18. The light-emitting device according to claim 17, further comprising:
an array substrate including a plurality of TFTs electrically connected to the plurality of cathode electrodes, wherein the light-emitting element includes the plurality of cathode electrodes for each of the plurality of subpixels and the anode electrode is common to the plurality of subpixels, and
the light-emitting element is driven for each of the plurality of subpixels via the plurality of cathode electrodes.

19. The light-emitting device according to claim 17, wherein the light-emitting element includes the cathode electrode common to the plurality of subpixels and the anode electrode common to the plurality of subpixels.

20. A light-emitting element comprising:
a plurality of cathode electrodes;
an anode electrode;
a plurality of light-emitting layers between the plurality of cathode electrodes and the anode electrode;
a plurality of electron transport layers between the plurality of light-emitting layers and the plurality of cathode electrodes; and
a hole transport layer between the plurality of light-emitting layers and the anode electrode, wherein:
the light-emitting element comprises a plurality of subpixels configured to output a plurality of lights of a plurality of light emission wavelengths of the plurality of light-emitting layers, respectively;
each of the plurality of subpixels includes a corresponding one of the plurality of cathode electrodes, a corresponding one of the plurality of electron transport layers, and a corresponding one of the plurality of light-emitting layers;
the hole transport layer and the anode electrode are common to the plurality of subpixels; and each of the plurality of light-emitting layers includes a layer of quantum dots of a plurality of types that emit light at wavelengths different from each other, and includes the quantum dots of an identical type in each of the plurality of subpixels that is identical.

* * * * *